United States Patent [19]

Erickson

[11] 3,778,671

[45] Dec. 11, 1973

[54] DIFFERENTIAL MAGNETIC DEFLECTION AMPLIFIER

[75] Inventor: Fred William Erickson, Northridge, Calif.

[73] Assignee: Litton Systems, Inc., Beverly Hills, Calif.

[22] Filed: Sept. 29, 1971

[21] Appl. No.: 184,881

[52] U.S. Cl. .......... 315/27 TD

[51] Int. Cl. .......... H01j 29/70

[58] Field of Search .......... 315/27 TD, 27 R, 315/18, 19

[56] References Cited

UNITED STATES PATENTS

| | | | |
|---|---|---|---|
| 3,488,552 | 1/1970 | Chandler et al. | 315/27 TD |
| 3,402,320 | 9/1968 | Christopher | 315/27 TD |
| 3,428,855 | 2/1969 | McDonald | 315/27 TD |
| 3,392,302 | 7/1968 | Schneider | 315/27 TD |
| 2,964,673 | 12/1960 | Stanley | 315/27 TD |
| 3,092,753 | 6/1963 | Steiger | 315/27 TD |
| 3,611,001 | 10/1971 | Bacon | 315/27 TD |
| 3,613,108 | 10/1971 | Spannhake | 315/27 TD |

*Primary Examiner*—Carl D. Quarforth
*Assistant Examiner*—J. M. Potenza
*Attorney*—Alan C. Rose et al.

[57] ABSTRACT

A differential magnetic deflection amplifier comprises a plurality of cascaded Class A biased emitter-coupled differential amplifier stages driving a high current output stage operated in a Class A-B bias. An antisaturation clamp is provided to assure linearity of feedback signals during major position moves, and voltage-on-demand means is provided to reduce power dissipation.

10 Claims, 2 Drawing Figures

PATENTED DEC 11 1973 3,778,671

Figure 1:
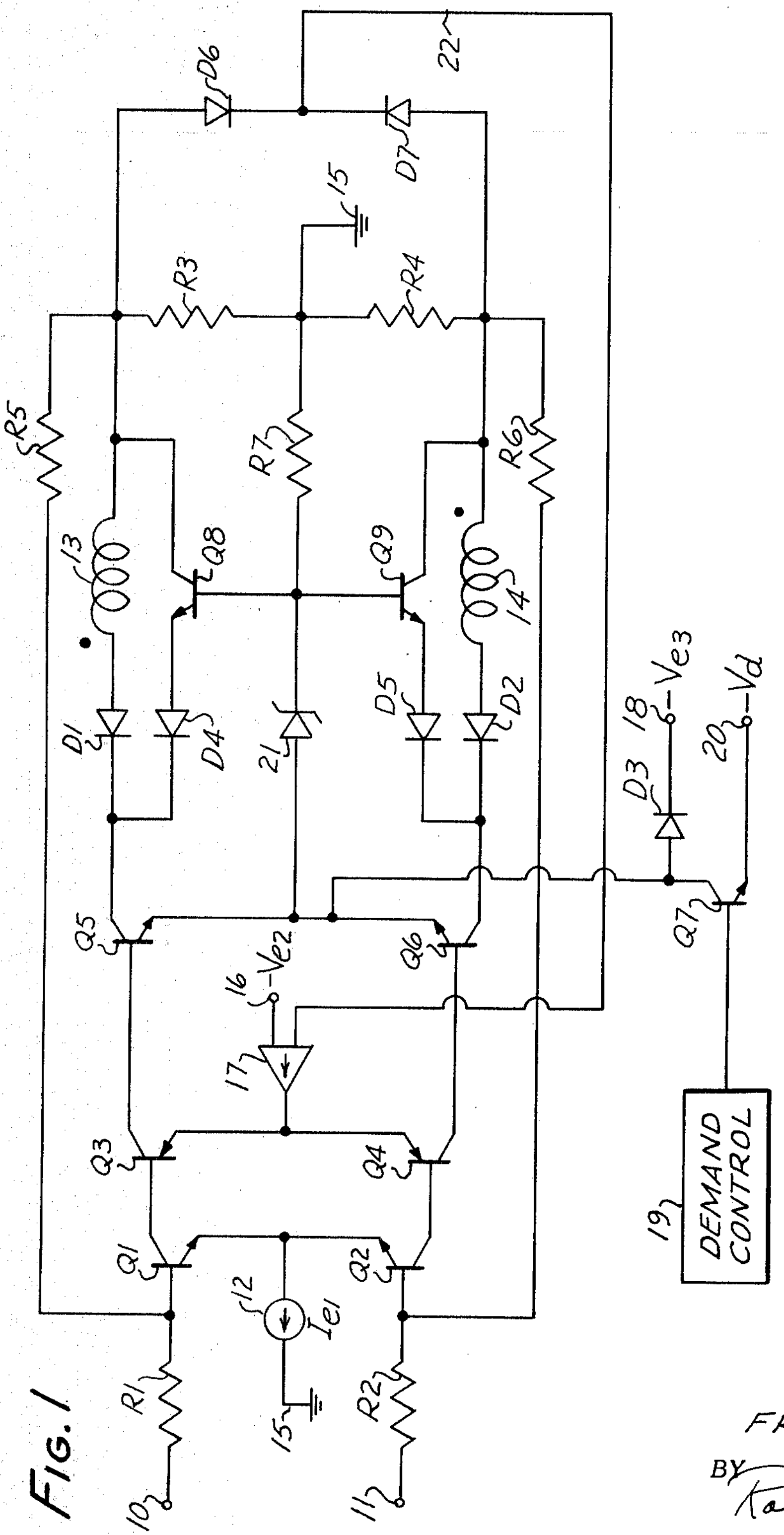

INVENTOR.
FRED W. ERICKSON
BY Robert M. Angus
ATTORNEY.

DIFFERENTIAL MAGNETIC DEFLECTION AMPLIFIER

This invention relates to differential magnetic deflection amplifiers, and particularly to Class A-B biased differential magnetic deflection amplifiers having antisaturation clamps and relatively rapid response times.

In the cathode ray tube art, electron beams are deflected by magnetic fields generated by a deflection coil having a current of predetermined magnitude flowing therethrough. The beam is deflected from side to side by altering the current amplitude through the deflection coils. Heretofore, the deflection currents for such deflection coils have been generated by Class A amplifiers. In such prior circuits, the currents were directed through pairs of coils. The sum of the currents was held constant, and by varying input signal, one of the currents was decreased in amplitude while the other was increased. The difference between the two currents was controlled by a differential feedback loop. Hence, the driving current source was held constant and high enough to produce the maximum current required to operate the differential amplifier. As a result, high average currents were supplied to the coils, thereby resulting in a high power dissipation during periods of small or no deflection.

Attempts have been made to utilize Class B differential magnetic deflection amplifiers wherein zero current passed through the deflection coils during periods of zero deflection, but such amplifiers have exhibited poor response times due to loss of gain through one side of the amplifier. Also, cross-over distortion sometimes occurs in Class B amplifiers when crossing through the zero deflection point.

It is an object of the present invention to provide a differential magnetic deflection amplifier in which the power dissipation is maintained relatively low when little or no deflection is desired, and which rapidly provides a relatively high current for large deflections.

Another object of the present invention is to provide an antisaturation clamp which provides relatively linear feedback in a differential amplifier during major position changes.

Another object of the present invention is to provide a voltage-on-demand circuit for a differential magnetic deflection amplifier so that the power dissipation of the amplifier is held to a relatively low amount during periods of minimal deflection and the power is increased for achieving major deflections.

In accordance with the present invention, a magnetic deflection amplifier is provided with a Class A-B bias which establishes a reference current for the differential amplifier during periods of little or no deflection. When it is desired to operate the amplifier to generate major deflection, the bias is increased on the amplifier to permit a rapid change in the current flowing through the deflection coils.

One feature of the present invention resides in the provision of an antisaturation clamp to divert current from the deflection coils to prevent saturation of transistors in the amplifier so that feedback through the amplifier is controlled at a relatively linear rate during major position changes.

Another feature of the present invention resides in the sensing of changes of current across the amplifier to control the Class A-B bias.

Yet another feature of the present invention resides in the provision of a voltage-on-demand circuit whereby the amplifier is supplied minimal power for periods of minimal deflection and the power is increased for major deflections.

Figure 2:
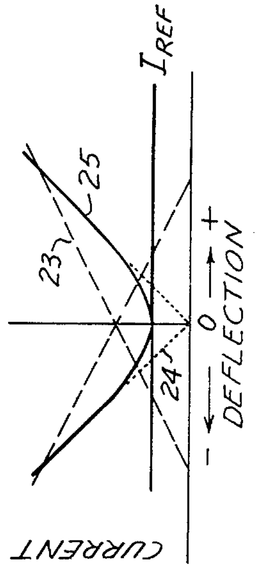

The above and other features of this invention will be more fully understood by the following detailed description and the accompanying drawings, in which:

FIG. 1 is a circuit diagram of a differential magnetic deflection amplifier in accordance with the presently preferred embodiment of the present invention; and FIG. 2 is a representation of the mode of operation of the amplifier illustrated in FIG. 1.

With reference to FIG. 1, there is illustrated a differential magnetic deflection amplifier in accordance with the presently preferred embodiment of the present invention. The amplifier has inputs 10 and 11 connected through resistors R1 and R2 to the bases of transistors Q1 and Q2, respectively. The emitters of transistors Q1 and Q2 are connected together to form a first emitter-coupled stage, and to emitter current source 12 ($I_{e1}$) providing a current flow toward ground 15. The collector of transistor Q1 is connected to the base of transistor Q3, and the collector of transistor Q2 is connected to the base of transistor Q4. The emitters of transistors Q3 and Q4 are connected together to form a second emitter-coupled pair, and the collectors of transistors Q3 and Q4 are connected to the bases of transistors Q5 and Q6, respectively. The collector of tansistor Q5 is connected through diode D1 to deflection coil 13 of a cathode ray tube (not shown) and the collector of transistor Q6 is connected through diode D2 to deflection coil 14 of the cathode ray tube. The emitters of transistors Q5 and Q6 are connected together to form a third emitter-coupled pair. The output from coil 13 is connected through load resistor R3 to ground 15 and the output from coil 14 is connected through load resistor R4 to ground 15. As illustrated in the drawings, transistors Q1 through Q6 are connected in a differential amplifier arrangement comprising three cascading stages of emitter-coupled amplifiers. A feedback loop is provided through resistors R5 and R6 to the bases of transistors Q1 and Q2, respectively. The emitter-coupled transistors Q3 and Q4 are connected to emitter current source 17 having an input connected to source 16 ($-V_{e2}$) and a second input at 22. Emitter voltage source ($-V_{e3}$) 18 is directly connected to the emitters of transistors Q5 and Q6 through diode D3.

Demand control circuit 19, which may, for example, comprise a suitable transistor switch, is connected to the base of transistor Q7 whose emitter is connected to source of potential 20 and whose collector is connected to emitters of transistors Q5 and Q6.

The anode of Zener diode 21 is connected to the emitters of transistors Q5 and Q6, and the cathode of Zener diode 21 is connected to the bases of transistors Q8 and Q9. The collector of transistor Q8 is connected to the junction between coil 13 and resistor R3, and the emitter of transistor Q8 is connected through diode D4 to the collector of transistor Q5. Likewise, the collector of transistor Q9 is connected to the junction between coil 14 and resistor R4 and the emitter of transistor Q9 is connected through diode D5 to the collector of transistor Q6. Resistor R7 is connected between the cathode of Zener diode 21 and ground 15.

The anode of diode D6 is connected to the junction between coil 13 and resistor R3, and the anode of diode D7 is connected to the junction between coil 14 and resistor R4. The cathodes of diodes D6 and D7 are connected together and through lead 22 to one input of amplifier 17. As shown in the drawings, transistors Q1, Q2 and Q5–Q9 may be npn transistors, and transistors Q2 and Q4 may be pnp transistors.

In operation of the apparatus illustrated in FIG. 1, current flows through diode D6 only when the signal on lead 22 is more negative than the voltage at the junction of resistors R3 and R5, that current flows through diode D7 only when the signal on lead 22 is more negative than the voltage at the junction of resistors R4 and R6. Diodes D6 and D7 select the most positive voltage (least negative) appearing across resistors R3 and R4 to derive an error voltage signal. The least negative voltage is compared by current source 17 to the reference voltage source 16 for the emitters of transistors Q3 and Q4. Source 17 derives a current proportionate to the difference between the error voltage on lead 22 and the reference voltage at source 16. The resultant current is applied to the emitters of transistors Q3 and Q4. Hence, if the least negative of the voltages across resistor R3 ($V_{R3}$) and resistor R4 ($V_{R4}$) differs from $V_{e2}$, current source 17 supplies a current signal proportional to that difference to the emitters of transistors Q3 and Q4. As a result the least negative of the voltage appearing across resistors R3 and R4 is adjusted by the feedback signal through current source 17 until it equals $V_{e2}$.

In the event that a signal is applied between inputs 10 and 11, transistors Q1 and Q2 will conduct to different levels, depending upon the amplitude and polarity of the input signal. As a result, the current through one of coils 13 and 14 will substantially increase. Hence, a more negative voltage appears across the load resistor R3 or R4 associated with the side of the amplifier carrying the greater current. However, the diode D6 or D7 associated with the side of the amplifier carrying the smaller current continues to pass the least negative voltage, so the minimum amplitude of the voltage appearing across resistors R3 and R4 equals the amplitude of source 16. For example, if the input signal between inputs 10 and 11 is of such polarity and magnitude as to cause a higher negative current flow through coil 13 and a higher negative voltage to appear across resistor R3, the voltage appearing across resistor R4 will be referenced through diode D7 to the emitters of transistors Q3 and Q4, so $V_{R4}=V_{e2}$, and $V_{R3}<V_{R4}$. Hence, the current through coil 14 would be equal to $V_{e2}/R4$ and the current through coil 13 would be equal to (Vi/R3) (R5/R1) + $I_{14}$, where $Vi$ is the magnitude of the input signal and $I_{14}$ is the reference current flowing through coil 14.

Linearity of the signal flowing through either of the feedback resistors R5 and R6 is established during a major deflection operation, by the antisaturation clamp cirucit formed by Zener diode 21, diodes D4 and D5 and transistors Q8 and Q9. Zener diode may, for example, have a breakdown voltage of about 4 volts. In the event that a negative signal is applied to the anodes of diodes D1 and D4 or D2 and D5, depending upon which coil is to be driven, the respective transistor Q8 or Q9 is biased to conduction upon breakdown of Zener diode 21 thereby establishing a bypass around the respective coil. The high negative signal is fed back through the respective feedback resistor R5 and R6 to the base of the respective transistor Q1 or Q2 to assure linear feedback and prevention of saturation of transistors Q5 and Q6.

From the foregoing, it is evident that the minimum current passing through either coil 13 or 14 is established by source 16. Hence, the circuit displays the advantages of Class B biasing by permitting minimal power dissipation through the coils during periods of minimal or zero deflection, and yet retains the advantages of Class A biasing by permitting rapid response to input signals. Thus, and as illustrated in FIG. 2, Class A biasing shown by dashed lines 23 requires high power dissipation during periods of non-deflections whereas Class B biasing, shown by dotted lines 24, does not achieve the gain required for high frequency response. With the Class A-B biasing of the last stage in accordance with the present invention, shown by solid line 25, power dissipation during periods of non-deflection may be minimized to a level less than in Class A bias, and higher gain is achieved than in Class B bias so higher frequency responses are realized.

One feature of the present invention resides in the provision of a voltage-on-demand circuit exemplified by demand control 19, transistor Q7 and source 20. By establishing the value of source 18 large enough to support minimal slow rate current, when it is desired to operate the deflection coils 13 and 14 to relatively large currents, demand control 19 may be operated, such as by a pre-condition signal, to operate transistor Q7 to connected a larger supply $V_d$ at 20 to the emitters of transistors Q5 and Q6.

Another feature of the present invention resides in the provision of the voltage-on-demand circuit which permits switching in of relatively high voltages to the emitters of the output stage so that a rapid response of the circuit is achieved. Hence, by applying a high voltage to the output stage emitters, the current response (dI/dt) is increased through the coils.

This invention is not to be limited by the embodiment shown in the drawings and described in the description, which is given by way of example and not of limitation, but only in accordance with the scope of the appended claims.

What is claimed is:

1. Clamps means for a Class A-B emitter-coupled differential magnetic deflection amplifier having a pair of emitter-coupled transistors having their respective collectors connected to first and second deflection coils comprising: means for sensing a voltage difference connected to the emitters of said transistors for sensing a voltage corresponding to a predetermined difference of currents flowing through said transistors; a first transistor having a collector, base and emitter and a second transistor having a collector, base and emitter; a first diode connected in series with the collector and emitter of said first transistor to form a first series path and a second diode connected in series with the collector and emitter of said second transistor to form a second series path; means connecting said first series path in parallel with said first coil and means connecting said second series path in parallel with said second coil; and means connecting said bases of said first and second transistors to said sensing means, said first and second diodes being so disposed and arranged as to pass current from said differential amplifier through the respective first and second transistor to prevent saturation of said pair of transistors in said deflection amplifier.

2. Apparatus according to claim 1 wherein said sensing means comprisies a Zener diode.

3. A differential amplifier for controlling the magnitude of currents through a pair of deflection coils means comprising:

a. a plurality of differential amplifier stages, a first amplifier stage in said plurality having an input means for receiving an input signal, a last amplifier stage in said plurality of amplifier stages having first and second outputs adapted to be applied, during operation, to first and second deflection coil means respectively to cause current flow through each coil means in response to an input signal;

b. a sense means for sensing the magnitude of the current amplitude carried by each of said first and second deflection coil means, said sense means having an input coupled to said first and to said second deflection coil means, said sense means producing an output signal proportional to the magnitude of the current in whichever coil means of said pair of deflection coils has the lesser of the magnitudes of the two currents; and c. means for maintaining at least a predetermined minimum current in each said deflection coil means, said means comprising means for comparing a pair of voltages coupled to receive and compare said output signal from said sense means and a reference voltage having a magnitude corresponding to a predetermined minimum current in each said deflection coil means, said comparator means producing an output current signal the magnitude of which is proportional to the difference between the reference voltage and the output of said sense means, the current output signal from said comparator means coupled to one differential amplifier stage in said plurality of amplifiers to cause the amplifiers to adjust the flow of current in whichever deflection coil has the lesser current magnitude so the output signal from said sense means is substantially equal to the reference voltage whereby the lesser magnitude of the current flow in each of said pair of deflection coil means is maintained at no less than a predetermined minimum value even in the absence of an input signal.

4. Apparatus according to claim 3 further including feedback means connected to said first and second coil means and to one of said amplifier stages for delivering a feedback signal from said first and second coil means to a respective side of said one amplifier stage.

5. A differential amplifier for controlling the magnitude of currents through a pair of first and second deflection coils means comprising:

a. a plurality of differential amplifier stages, a first amplifier stage in said plurality having an input means for receiving an input signal, a last amplifier stage in said plurality of amplifier stages having first and second outputs adapted to be applied, during operation, to first and second deflection coil means respectively to cause current flow through each coil means in response to an input signal;

b. a first means for sensing the magnitude of the current amplitude carried by each of said first and second deflection coil means, said sense means having an input coupled to said first and to said second deflection coil means, said first sense means producing an output signal proportional to the magnitude of the current in whichever coil means of said pair of deflection coils has the lesser of the magnitudes of the two currents;

c. means for comparing a pair of voltage coupled to receive and compare said output signal from said first sense means and a reference voltage having a magnitude corresponding to a predetermined minimum current in each said deflection coil means, said comparator means producing an output current signal the magnitude of which is proportional to the difference between the reference voltage and the output of said first sense means, the current output signal from said comparator means coupled to one differential amplifier stage in said plurality of amplifiers to cause the amplifiers to adjust the flow of current in whichever deflection coil has the lesser current magnitude so the output signal from said first sense means is substantially equal to the reference voltage whereby the lesser magnitude of the current flow in each of said pair of deflection coil means is maintained at no less than a predetermined minimum value even in the absence of an input signal;

d. feedback means connected to said first and seocnd coil means and to one of said amplifier stages for delivering a feedback signal from said first and second coil means to a respective side of said one amplifier stage; and e. means for clamping a signal connected to said last amplifier stage to bypass said first and second coil means respectively for establishing a linear feedback signal to said feedback means and for preventing saturation of said last stage by selectively passing current around said first and second coil means.

6. Apparatus according to claim 5 wherein said clamp means comprises a second means for sensing a voltage difference connected to said last amplifier stage for sensing a voltage corresponding to predetermined difference of currents between the sides of said last amplifier stage, and first and second bypass means connected in parallel to said first and second coil means, respectively, and connected to said second sense means establishing a current bypass path around the respective first and second coil means in response to operation of said second voltage sensing means detecting a voltage corresponding to said predetermined unbalance of currents 7. Apparatus according to claim 6 wherein each amplifier stage comprises a pair of emitter-coupled transistors, said stages being cascaded so that the base of each transistor of one stage is coupled to the collector of a respective transistor of a prior stage, said second means for sensing a voltage difference being connected to the emitters of the transistors of the last stage and connected said first and second bypass means, said first and second coil means being connected to respective collectors of transistors of said last stage, said first sense means comprising first and second resistor means connected between a supply potential and said first and second coil means respectively for sensing current flow through a corresponding coil means, and first and second diodes connected in parallel with said first and second resistor means for sensing at the junction of said first and second diodes the smaller of the voltages across said first and second resistor means corresponding to the smaller current flow in said first and second coil means, said comparator means comprising a source of current connected to the emitters of the transistors of an amplifier stage prior to said last stage.

8. Apparatus according to claim 7 wherein said second means for sensing a voltage difference comprises a Zener diode.

9. A differential amplifier for controlling the magnitude of currents through a pair of deflection coils means comprising:

a. a plurality of differential amplifier stages, a first amplifier stage in said plurality having an input means for receiving an input signal, a last amplifier stage in said plurality of amplifier stages having first and second outputs adapted to be applied, during operation, to first and second deflection coil means respectively to cause current flow through each coil means in response to an input signal, each said amplifier stage comprising a pair of emitter-coupled transistors, said stages being cascaded so that the base of each stage is coupled to the collector of a respective transistor of a prior stage, said first and second coil means being connected to respective collectors of transistors of said last stage;

b. a first sense means for sensing the magnitude of the current amplitude carried by each of said first and second deflection coil means, said sense means having an input coupled to said first and to said second deflection coil means, said sense means producing an output signal proportional to the magnitude of the current in whichever coil means of said pair of deflection coils has the lesser of the magnitudes of the two currents, said first sense means comprising first and seocnd resistors means connected between a supply potential and said first and second coil means respectively for sensing current flow through a corresponding coil means, and first and second diodes connected in parallel with said first and second resistor means for sensing at the junction of said first and second diodes the smaller of the voltages across said first and second resistor means corresponding to the smaller current flow in said first and second coil means; and c. means for comparing a pair of voltages coupled to receive and compare said output signal from said first sense means and a reference voltabe having a magnitude corresponding to a predetermined minimum current in each said deflection coil means, said comparator means comprising a source of current connected to the emitters of the transistors of an amplifier stage prior to said last stage, said comparator means producing an output current signal the magnitude of which is proportional to the difference between the reference voltage and the output of said first sense means, the current output signal from said comparator means coupled to one differential amplifier stage in said plurality of amplifiers to cause the amplifiers to adjust the flow of current in whichever deflection coil has the lesser current magnitude so the output signal from said sense means is substantially equal to the reference voltage whereby the lesser magnitude of the current flow in each of said pair of deflection coil means is maintained at no less than a predetermined minimum value even in the absence of an input signal.

10. Apparatus according to claim 9 further including demand means for selectively increasing the emitter potential for the emitters of the transistors of said last stage.

* * * * *